United States Patent [19]

Berry

[11] 4,197,143
[45] Apr. 8, 1980

[54] METHOD OF MAKING A JUNCTION FIELD-EFFECT TRANSISTOR UTILIZING A CONDUCTIVE BURIED REGION

[75] Inventor: Robert Berry, Cupertino, Calif.

[73] Assignee: Fairchild Camera & Instrument Corporation, Mountain View, Calif.

[21] Appl. No.: 921,637

[22] Filed: Jul. 3, 1978

Related U.S. Application Data

[62] Division of Ser. No. 720,467, Sep. 3, 1976, Pat. No. 4,118,728.

[51] Int. Cl.[2] .................. H01L 29/80; H01L 21/263
[52] U.S. Cl. ...................................... 148/1.5; 148/187; 357/23; 357/41; 357/91
[58] Field of Search ................... 148/1.5, 187; 357/23, 357/22, 91, 41

[56] References Cited

U.S. PATENT DOCUMENTS

| | | | |
|---|---|---|---|
| 3,873,383 | 3/1975 | Kooi | 148/187 |
| 3,891,469 | 6/1975 | Moriyama et al. | 148/1.5 |
| 3,993,513 | 11/1976 | O'Brien | 148/175 |
| 4,011,105 | 3/1977 | Paivinen et al. | 148/1.5 |
| 4,055,444 | 10/1977 | Rao | 148/1.5 |
| 4,118,728 | 10/1978 | Berry | 357/22 |

OTHER PUBLICATIONS

Moline et al., "Self-Aligned . . . Chan. Stops . . . ", IEEE Trans., vol. ED20, 1973, 1129.

Primary Examiner—L. Dewayne Rutledge
Assistant Examiner—Upendra Roy
Attorney, Agent, or Firm—Alan H. MacPherson; Robert C. Colwell

[57] ABSTRACT

In an oxide isolated semiconductor structure having an epitaxial layer formed on a monocrystalline substrate, a buried, laterally extending PN isolation junction in said structure, and oxidized isolation regions extending through said epitaxial layer to said PN isolation junction, thereby to form a plurality of electrically isolated pockets of semiconductor material, a dopant is located in those regions of the semiconductor material directly adjacent the oxidized isolation regions to prevent unwanted current flow called "channeling." The region formed by this dopant is often referred to as the field predeposition region. Typically, to form the field predeposition region, a selected dopant is placed in the exposed surface regions of the epitaxial semiconductor material just prior to the formation of the oxidized isolation regions. The field predeposition and oxidation of the epitaxial semiconductor material also cause the formation of a conductive buried region from that portion of the field predeposition dopant in the epitaxial pockets directly adjacent the oxidized semiconductor material. If desired, a collector sink then may be formed in the epitaxial pocket without disrupting the function of the conductive buried region. The conductive buried region may be utilized to facilitate manufacture of smaller memory circuits than heretofore available, compact junction field effect transistors, and other integrated circuit structures.

8 Claims, 18 Drawing Figures

METHOD OF MAKING A JUNCTION FIELD-EFFECT TRANSISTOR UTILIZING A CONDUCTIVE BURIED REGION

This is a division, of application Serial No. 720,467 U.S. Pat. No. 4,118,728, filed Sept. 3, 1976.

BACKGROUND OF THE INVENTION

1. Field of the Invention

This invention relates to semiconductor devices and in particular to integarted circuit structures.

2. Prior Art

Numerous techniques for electrically isolating semiconductor structures have been developed and are well-known in the art of semiconductor fabrication. See, for a list of papers describing such techniques, A. H. Agajanian's article entitled "A Biography on Semiconductor Device Isolation Techniques," Solid State Technology, April, 1975. Also well-known are methods of forming oxidized isolation regions in integrated circuit structures. For example, U.S. Pat. No. 3,648,125 entitled "Method of Fabricating Integrated Circuits with Oxidized Isolation and the Resulting Structure" issued Mar. 7, 1972, to Douglas L. Peltzer (hereinafter referred to as the Peltzer patent) discloses techniques for fabricating substantially smaller transistors, diodes, and resistors than the then existing prior art. In one such technique disclosed by the Peltzer patent, an epitaxial layer of silicon is formed on a silicon substrate and divided into electrically isolated pockets by a grid of oxidized regions of the silicon material in conjunction with a laterally extending PN isolation junction. Active and/or passive components such as diodes, transistors, and resistors may be formed in the electrically isolated pockets.

In the fabrication of vertical transistors according to the Peltzer patent and using a P type substrate and a P type epitaxial layer, a buried layer of N conductivity type semiconductor material (typically called a "buried collector region," "buried collector layer," or a "buried collector") formed in selected locations of the substrate and the epitaxial silicon layer may serve as a collector. In one embodiment, one or more emitters may then be formed in selected regions by diffusion or by otherwise introducing suitable N type impurities into the upper surface of the epitaxial silicon. The epitaxial silicon material beneath each emitter, but above the collector, functions as the base of the transistor. Ohmic contact to the buried collector regions may be achieved by diffusing, or otherwise inserting, a selected N type impurity into selected regions of the epitaxial silicon to convert these regions to the same conductivity type as the buried collector if the epitaxial layer is not already of the same conductivity type as the buried collector.

One problem arising in the manufacture of integrated circuits which utilize various embodiments of the oxide isolation techniques disclosed in the Peltzer patent and elsewhere is channel inversion or MOS channeling. Channel inversion may occur in oxide isolated integrated circuit structures between adjacent but noncontiguous N type buried collector regions. Usually occurring at the interface between the P type silicon and the overlying oxide, channel inversion results from a variety of causes, for example, from the presence of impurities in the oxide, typically sodium ions having a net positive charge which "mirror", or attract, electrons in the underlying P type silicon. If enough electrons are attracted, a very thin region of the P type silicon will be converted to N type semiconductor material, creating an N type channel between the adjacent buried collector regions. Channel inversion causes theoretically isolated collector regions to be effectively electrically connected to each other, thereby degrading or thwarting the function of the device and/or circuit. Channel inversion usually cannot be completely prevented by forming oxide of high purity, as only a few parts per billion of sodium impurity in the oxide may be sufficient to cause channel inversion in a lightly doped substrate.

Channel inversion has been frequently studied in conjunction with the manufacture of MOS transistors in which it is necessary to prevent unwanted leakage currents and to control threshold voltages. Three of the standard MOS techniques for preventing channel inversion are: (1) channel stops (which are heavily doped regions adjacent selected surfaces), (2) other forms of surface doping control, and (3) phosphorus gettering of sodium impurities in surface oxides.

One technique for preventing channel inversion is the formation of a guard ring surrounding selected regions of the integrated circuit structure. The guard ring is usually created by diffusing, or otherwise inserting, a selected impurity into desired locations of the semiconductor material thereby to create inversion-preventing regions of selected conductivity type and impurity concentration.

A further technique for preventing channel inversion has been employed by B. T. Murphy at Bell Laboratories, and is discussed in W. J. Evans et al, "Oxide Isolated Monolithic Technology and Applications," *IEEE Journal of Solid-State Circuits*, Vol. SC-8, No. 5, October 1973. This reference discloses that after completely forming the oxide isolation for a given device, gallium is diffused through the oxide to strongly dope those regions of semiconductor material beneath the oxide, thereby preventing channel inversion by creating regions of opposite conductivity type to the buried collector regions.

U.S. Pat. No. 3,873,383 issued Mar. 25, 1975, on an application of Kooi and entitled "Integrated Circuits with Oxidation-Junction Isolation and Channel Stop" discloses a channel stop formed in an oxide-insolated integrated circuit structure. While Kooi discloses using a predeposition region to contact the substrate beneath the epitaxial layer in the absence of a buried collector region, Kooi fails to suggest or disclose the potential advantageous use of the channel stop region to provide a conductive buried region which conducts current in a lateral direction, and thereby makes possible a significant reduction in memory cell size.

SUMMARY OF THE INVENTION

In a copending application of Martin J. Alter entitled "A Method of Fabricating Conductive Buried Regions in Integrated Circuits and the Resulting Structures" filed on Sept. 3, 1976, having Ser. No. 720,550, and assigned to the same assignee (Fairchild Camera and Instrument Corporation) as this application, there is disclosed doped regions in oxide isolated integrated circuit structures which doped regions can be used to create novel collector sink bypasses, interleaved resistors, and resistors having a higher resistivity per unit length than resistors previously available. These doped regions are formed in epitaxial silicon material directly abutting the isolation oxide between the buried collector regions and the surface of the epitaxial layer. Alter calls these regions, when used as described in his specification, "conductive buried regions" or "walled resistors." Alter's conductive buried regions typically are annular-shaped and surround collector sinks, collector contact regions, and certain other oxide isolated structures. Alter uses the word "annular" in a much broader sense than conventional to refer to a closed path, sometimes a toroid, but more typically nontoroidal (such as, without limitation, rectangular) without regard to uniformity to cross-section. Alter refers to these annular-shaped conductive buried regions as being a portion of the region formed by what is commonly referred to in the semiconductor processing arts as a "field predeposition" step. The term "field predeposition," however, is not intended to limit the methods by which these conductive buried regions are formed. For example, diffusion, or any other suitable process, may be utilized to form these regions. The annular-shaped "conductive buried region" is located in the epitaxial layer and is electrically isolated from other regions formed by the field predeposition process when the oxide isolation or other insulating material is formed and extended to the buried collector region.

The size of the conductive buried region may be adjusted by varying the parameters of the process by which it is formed, and by varying the size of the collector sink, collector contact region, or other structure in which the conductive buried region is formed. In fact, in certain cases the conductive buried region can be eliminated completely by selected process changes. For example, suitable control of the etching of the epitaxial silicon prior to field oxide formation together with appropriately long thermal diffusion of the collector sink may totally eliminate the conductive buried region. That is, the impurity concentration of the conductive buried region is everywhere overcompensated by the impurity concentration of the collector sink. Prior to Alter's invention, this overcompensation was not necessarily undesirable.

In the formation of isolated pockets of epitaxial silicon in oxide isolated integrated circuit structures, after definition of the buried collector and the formation of the epitaxial silicon grooves or depressions are created in the epitaxial silicon where isolation regions are to be formed. The thereby exposed surface regions of epitaxial silicon are doped with an impurity selected to create in these surface regions a conductivity type opposite the conductivity type of the buried collector layer. After formation of the field oxide by oxidation of these exposed, doped surface regions of epitaxial silicon, significant amounts of the selected impurity remain in the regions of silicon material (either epitaxial or monocrystalline) directly adjacent the oxide.

In one embodiment of Alter's application, the substrate silicon semiconductor material is P type and the exposed surfaces of the grooves are doped with P type impurities and then oxidized to produce the field oxide. The field oxide is formed so as to contact the buried collector regions and thus isolate pockets of semiconductor material. Active and/or passive devices are formed in each of these pockets. Thus that portion of the conductive buried region above the buried layer is isolated electrically from the remaining portions of the silicon substrate material containing predominantly the selected P type impurity by the buried collector regions and the oxidized isolation regions (i.e., the field oxide). The conductive buried region in each pocket of semiconductor material will be directly adjacent the non-horizontal portion of the field oxide. Each conductive buried region can comprise, and indeed sometimes will be referred to as a "walled" resistor, although, as disclosed by Alter, the conductive buried region can be utilized in many different ways not usually associated with the term "resistor," for example, as a sink bypass, or, in general, a conductor of electrical current. Numerous other structures may be fabricated with the conductive buried regions in which the substrate is either P or N type material, the epitaxial layer P or N type, and the impurity dopant P or N type. Particularly useful embodiments are those in which the buried collector is of chosen conductivity type, while the semiconductor substrate and conductive buried region are of opposite conductivity type.

The conductive buried region is typically electrically isolated from other portions of the region formed by the field predeposition step by the oxide isolation-buried collector interface. That is, the impurity dopant in that portion of the semiconductor surface which, when oxidized, diffuses into the buried collector and there is over-compensated by the impurity concentration of the buried collector. In other embodiments only selected portions of the conductive buried region will be isolated. In still further embodiments, for example, when an N type epitaxial layer is utilized with a P type field predeposition, or vice versa, formation of a collector sink is not necessary to electrically isolate the conductive buried region from the remainder of the epitaxial material.

In accordance with my invention, I make use of the conductive buried region to form a two transistor memory circuit in a compact arrangment in which, contrary to the prior art, the base, collector, emitters, and base resistors of each transistor are collinear (i.e., lie in the same straight line). A pair of two-emitter transistors, commonly utilized in memory cells, can therefore be formed within a region of the wafer substantially smaller than conventionally available memory cells which typically cannot be formed collinearly without consuming relatively large amounts of the wafer surface. Further, in one embodiment of this invention, the base pull up resistors of each of a pair of transistors in one memory cell have equal resistance.

In another embodiment of my invention, a compact junction field effect transistor is formed in which a pair of conductive buried regions or walled resistors function as the channel.

In further embodiments of my invention, the conductive buried region is utilized as an emitter or collector of a compactly-formed transistor. In this embodiment the epitaxial silicon layer functions as the base of a transistor while an additional region is formed at the surface of the epitaxial silicon to function as a collector or emitter as determined by the function of the conductive buried region.

DETAILED DESCRIPTION

The semiconductor structure of this invention is fabricated utilizing the process depicted in FIGS. 1 through 5. The structure shown in FIG. 1 may be fabricated in the following well-known manner.

1. Oxidize P substrate 10.
2. Form an opening in the oxide (not shown in FIG. 1) and diffuse N type regions 11 which serve as buried collectors and isolation regions.
3. Remove the remaining oxide (not shown) and grow P type silicon epitaxial layer 12.
4. Thermally grow oxide layer 13, deposit silicon nitride layer 14, and mask both layers by conventional techniques.
5. Etch field isolation regions 15a and 15b.

Figure 1:
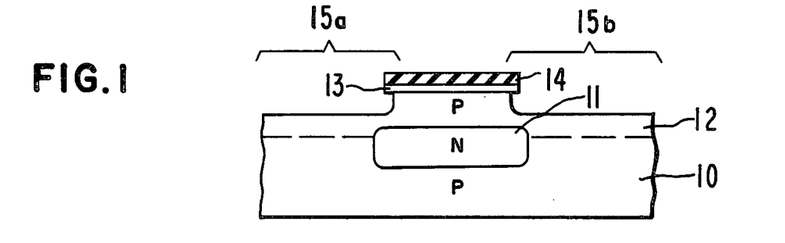
FIGS. 1, 2, 3, 4, 4a, 4b and 5 illustrate a process by which the conductive buried regions used in my invention are formed, and one structure showing the conductive buried region.
Figure 2:
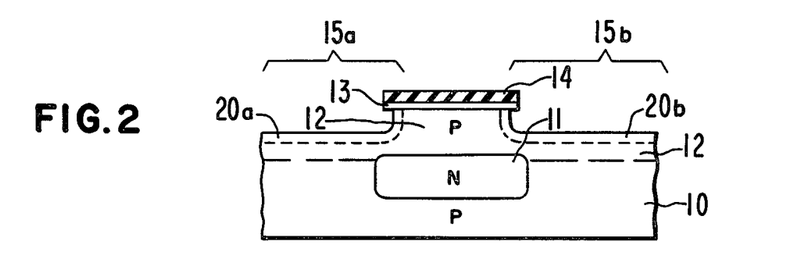

In FIG. 2 a field predeposition region 20a and 20b of P+ type semiconductor material has been introduced into the exposed surfaces of epitaxial layer 12. This may be accomplished by diffusion or by any other suitable process. Note that the field predeposition does not penetrate the nitride and oxide layers 13 and 14 respectively and that the field predeposition regions are confined to those areas adjacent to the exposed epitaxial silicon surfaces. As has been discussed, one purpose of field predeposition 20 is to prevent channel inversion between adjacent buried collector regions, for example, between region 11 and the next adjoining buried collector region (not shown). The P+ type semiconductor material 29a and 20b increases the doping concentration at the surface regions of grooves 15a and 15b to prevent channel inversion after subsequent formation of the field oxide. Accordingly, the field predeposition region 20a and 20b is of differing conductivity from surrounding regions. For example, in some embodiments field predeposition region 20 will be of higher conductivity than adjacent semiconductor material, while in other embodiments it will be of different conductivity type. Other uses of the field predeposition are discussed below.

Figure 3:
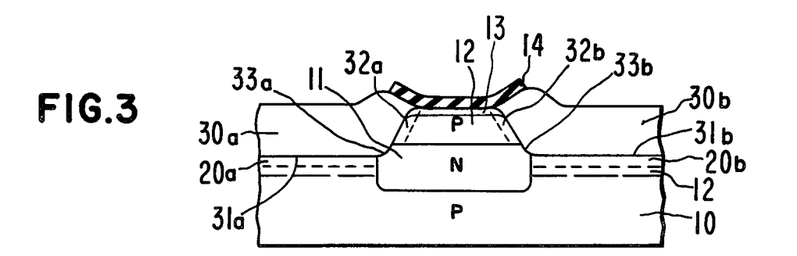

After formation of field oxide regions 30a and 30b according to well-known techniques, the appearance of a cross-section of the semiconductor structure is shown in FIG. 3. Because of volume of the silicon dioxide which typically comprises region 30a and 30b is greater than the volume of the epitaxial silicon 12 from which it is formed, the edges of silicon nitride layer 14 are lifted and a "bird-beak" shape is created similar to that depicted in FIG. 3. Because the field isolation region 30a and 30b is typically formed by a thermal oxidation process, a portion of the dopant in the P+ doped field predeposition region 20a and 20b diffuses into the epitaxial layer 12 ahead of the silicon dioxide-silicon interface 31a and 31b.

When a sufficient amount of oxide has been formed to extend through the epitaxial layer 12 to contact buried collector region 11, a portion 32a and 32b of the field predeposition region will usually be electrically isolated from the remainder of the field predeposition region 20a and 20b. The isolated portion 32a and 32b of the field predeposition region will be primarily adjacent to the nonhorizontal portion of the silicon dioxide-epitaxial silicon interface 31a and 31b. As previously discussed, the isolated portion 32a and 32b of the field predeposition region will be referred to as a conductive buried region, or in some embodiments as a "walled" resistor or a "sink by-pass resistor".

The conductive buried region 32a and 32b usually will be electrically isolated from other portions of the field predeposition region 20a and 20b by the field oxide-buried collector interface 33a and 33b. This electrical isolation occurs because the impurity concentration of the buried collector region 11 overcompensates the impurity concentration of field predeposition region 20a and 20b in those regions 33a and 33b where regions 20a and 20b intersect the buried collector 11. The resistance per unit length of the conductive buried region 32a and 32b may be controlled by the concentration and depth of the field predeposition region, the epitaxial thickness, and by the extent to which a collector sink, if formed, encroaches upon the field predeposition region. In other embodiments, the conductive buried region may be electrically isolated without forming a buried collector 11 by selecting appropriate conductivity type materials, for example, use of a chosen conductivity type material for the substrate and an opposite conductivity type material for the field predeposition region. For example, a heavily doped N+ substrate can have formed on it a more lightly doped P type or N type epitaxial layer. If the epitaxial layer is N type, a P type predeposition region can be formed on the surfaces of grooves formed in the epitaxial layer with such a concentration that the dopant in the N+ substrate overcompensates the P type dopant in the substrate while the P type dopant overcompensates the N type dopant in the epitaxial layer. The result is to form walled resistors or conductive buried regions in the epitaxial semiconductor material. If the epitaxial layer is P type, an N type impurity can be placed in the epitaxial layer in such a manner as to leave P type walled resistors or conductive buried regions formed from a P type predeposition region. Of course, similar structures may be built with all conductivity types reversed.

Figure 4:
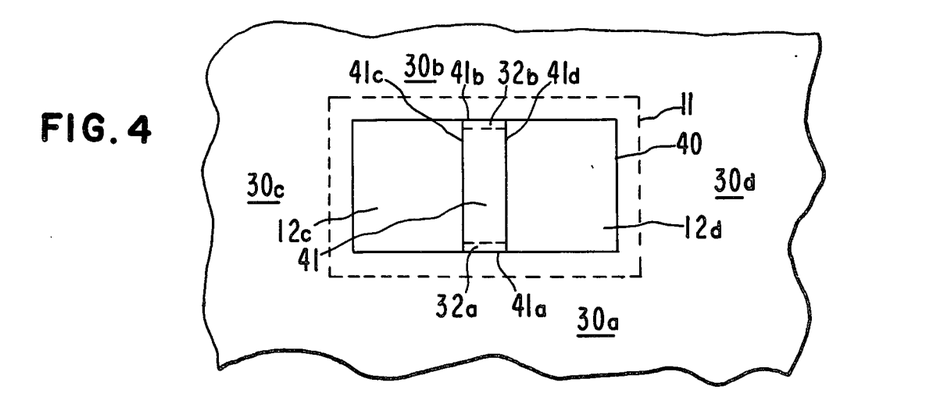

In one embodiment of this invention silicon nitride layer 14 is then removed from those portions of the wafer surface where collector sink depositions are desired. Following this partial removal of silicon nitride layer 14, the appearance of a plan view of the structure is shown in FIG. 4. Note that field isolation region 30a, 30b, 30c and 30d completely surrounds the perimeter of electrically isolated pocket 40. The perimeter of buried collector 11 is indicated on FIG. 4 by a dashed line. FIG. 4 also depicts the appearance of the wafer surface following formation of a collector sink 41. Collector sink 41 will usually be formed by predeposition and diffusion of N type semiconductor material, although other well-known processes may also be used.

With appropriately controlled etching and thermal diffusion processes, the N type impurity which forms collector sink 41 for contact to buried collector 11, will not penetrate into the perimeter of epitaxial layer 12 immediately above buried layer 11. This effect is shown in FIG. 4a; see regions 32a and 12a.

Because of the above described phenomenon, conductive buried regions 32a and 32b (see FIGS. 4, 4a and 4b) are not overcompensated by the impurity used to control the conductivity type of collector sink 41. Accordingly, conductive buried regions 32a and 32b provide an electrically isolated conducting path between regions 12c and 12d which are disposed on opposite sides of collector sink 41. This embodiment of conductive buried regions 32a and 32b which provides a conducting path around the collector sink 41 will be referred to herein as a collector sink bypass. In certain embodiments formed by various processing techniques in which the epitaxial layer 12 and the conductive buried region 32 are the same conductivity type and in which a collector sink 41 of opposite conductivity type is formed in the epitaxial silicon 12, a small portion of epitaxial silicon 12a (FIGS. 4a and 4b) of the same conductivity type as the conductive buried region may remain after the sink 41 is formed. In such circumstances the conductive buried region 32a, together with the small portion of epitaxial silicon 12a, serves as the collector sink bypass. The relative electrical currents carried by the epitaxial silicon 12a and the conductive buried region 32a will be in part determined by their relative impurity concentrations and cross-sectional areas. In general, however, the major portion of the current will be carried by the conductive buried region 32a.

The conductive buried region may be fabricated in embodiments having a wide range of shapes and dimensions. For example, a collector sink junction depth of 1.5 microns and an oxide isolation dept of 1.8 microns have been found to produce suitable results and can be achieved by a variety of combinations of process parameters.

Figure 4A:
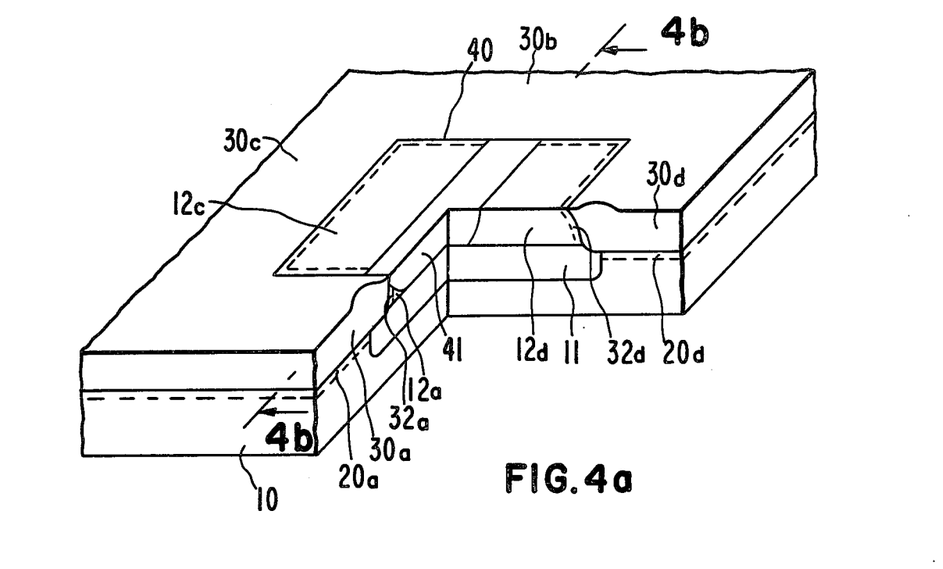
Figure 4B:
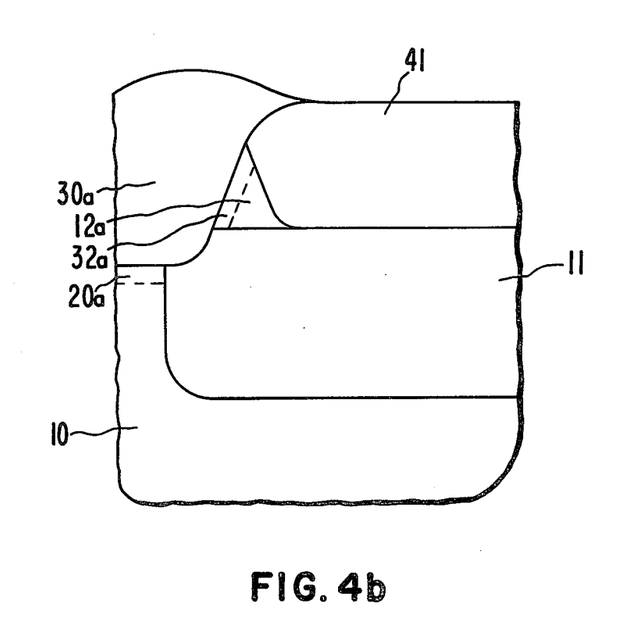

FIG. 4a shows a cross-section of the wafer shown in FIG. 4, together with conductive buried region or collector sink bypass 32a, field oxide isolation region 30a, 30b, 30c and 30d, buried collector 11, and field predeposition region 20a and 20d. An additional collector sink bypass (32b) will also be present at the opposite end of collector sink 41 from collector sink bypass 32a. This additional collector sink bypass (32b) is not shown in FIG. 4a. Silicon nitride layer 14 is not shown in FIG. 4a, but if shown would overlie regions 12c and 12d. An enlarged view of a portion of FIG. 4a is shown in FIG. 4b.

Figure 5:
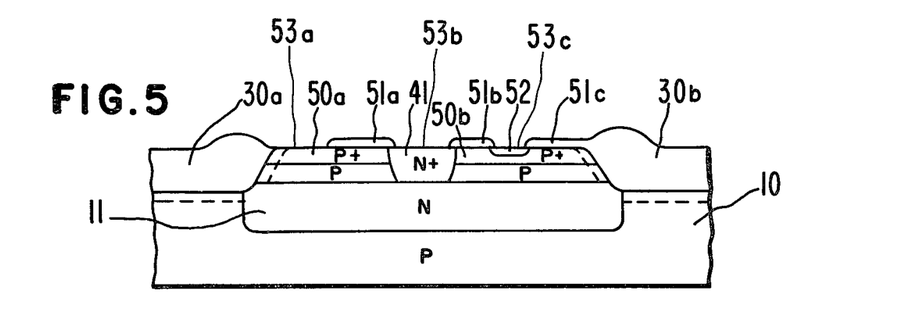

The semiconductor structure shown in FIGS. 4 and 4a may be subjected to various well-known semiconductor manufacturing processes to obtain the structure shown in FIG. 5. For example, the structure shown in FIG. 5 may be obtained from that shown in FIG. 4 by the following steps:

1. In a well-known manner remove silicon nitride layer 14 from regions 12c and 12d.
2. Perform base predeposition and diffusion thereby forming regions 50a and 50b.
3. Form oxide layer 51.
4. Form an opening in oxide layer 51 for forming emitter region 52, also reopening collector sink contact region 41.
5. Perform the emitter diffusion.
6. Form washed emitter 52 and its equivalent in region 41.
7. Form contact opening 53a in layer 51 for electrical contact to P+ region 50a.
8. Deposit metal interconnect layer and form desired interconnect pattern (not shown). Typically, aluminum-silicon or its equivalent is employed when washed emitters have been formed. (The results of this step are not shown in FIG. 5).

The conductive buried region allows electrical contact to base region 50b to be made at region 50a, as regions 50a and 50b are electrically connected by conductive buried regions 32a, and 32b (shown in FIG. 4).

Figure 6A:
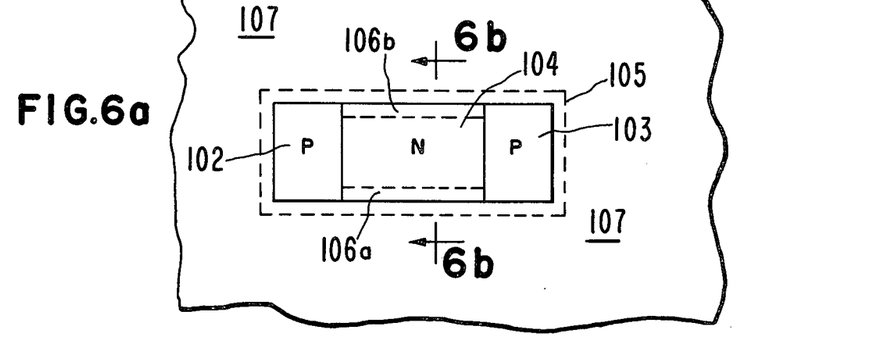
FIGS. 6a and 6b depict plan and cross-sectional views of an embodiment of my invention which comprises a junction field effect transistor.
Figure 6B:
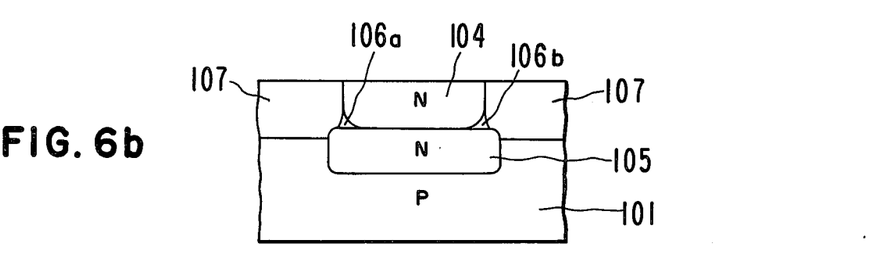

One embodiment of this invention wherein the field predeposition region functions as the channel of a junction field effect transistor is shown in FIGS. 6a and 6b. Junction field effect transistors are well-known in the semiconductor arts; e.g., see A. S. Grove, *Physics and Technology of Semiconductor Devices*, Wiley and Sons, 1967.

The semiconductor structure shown in FIGS. 6a and 6b may be formed in the manner described in conjunction with FIGS. 1–5. Of course, as shown in FIGS. 6a and 6b, the P type source and drain regions 102 and 103 are formed adjacent N type sink region 104. Field predeposition region 106 serves as the channel of the junction field effect transistor, region 102 as the source, region 103 as the drain, sink 104 and buried collector or portions of semiconductor material beneath the laterally extending PN isolation junction as the gate, and field oxide 107 and buried layer 105 as electrical isolation from surrounding regions of substrate 101. As with other junction field effect transistors, channel modulation is achieved by applying bias across the PN junction between the gate and the channel. Source 102 and drain 103 are formed in any well-known manner, e.g., by impurity diffusion or ion implantation. Electrical connections are made to source 102 and drain 103 by forming ohmic contacts to the upper surface of source region 102 and drain region 103.

Figure 7A:
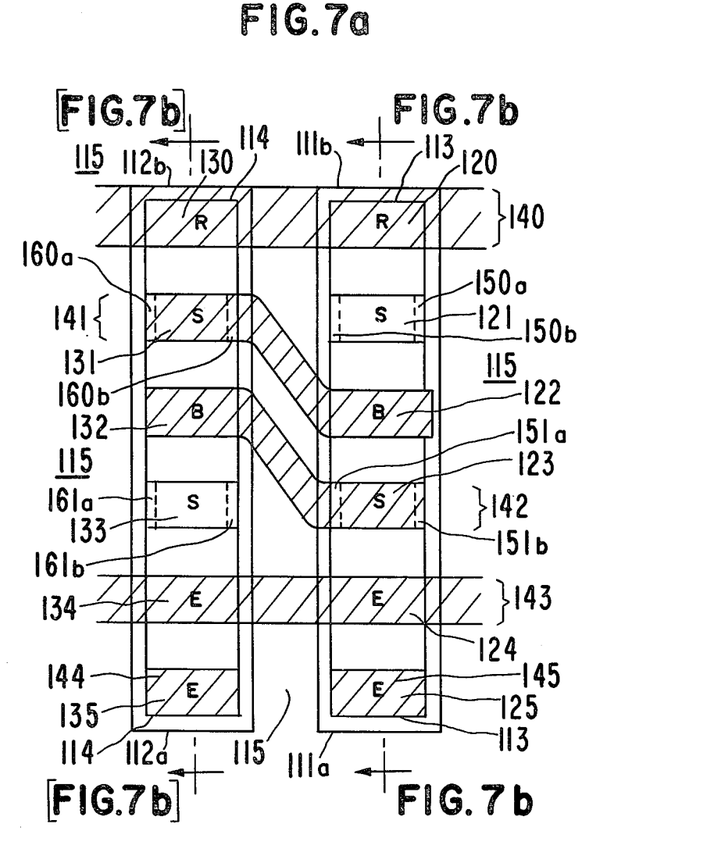
FIGS. 7a and 7b depict plan and cross-sectional views of an embodiment of my invention as a memory cell.
Figure 7B:
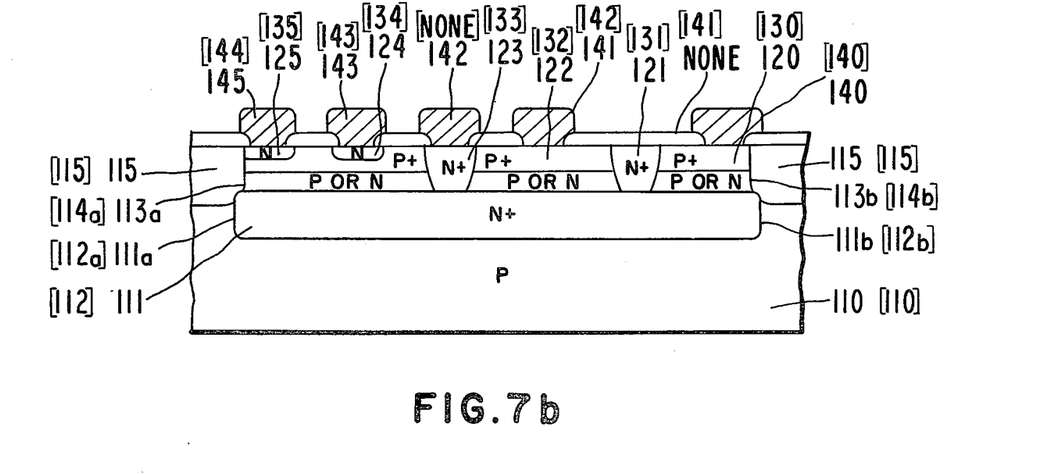
Figure 8:
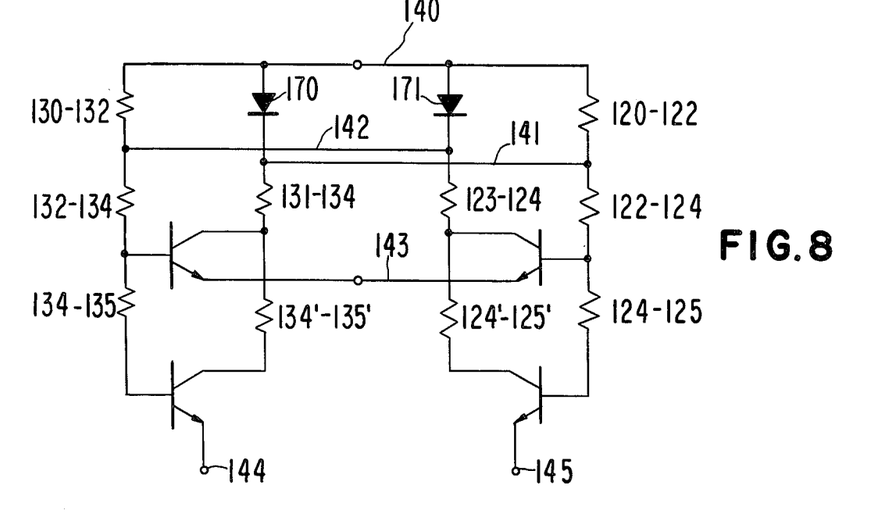
FIG. 8 is a circuit schematic of the structure shown in FIGS. 7a and 7b.

Another embodiment of this invention is depicted in FIGS. 7a, 7b and 8. Shown in FIG. 7a is a plan view of a memory cell wherein a pair of collinear two emitter transistors are disposed parallel to each other and electrically connected. A cross-sectional view of the structure shown in FIG. 7a appears as FIG. 7b. Because the cross-sectional view for each of the pair of two emitter transistors shown in FIG. 7a is identical except for metal contacts, the structure shown in FIG. 7b is representative of two different cross-sections taken through the structure shown in FIG. 7a. The numbers in brackets in FIG. 7b are used to denote the regions intersected by the cross-section designated [FIG. 7b] in FIG. 7a. For example, the cross-section designated FIG. 7b in FIG. 7a passes through emitter 124, while the cross-section designated [FIG. 7b] passes through a corresponding emitter 134, denoted in FIG. 7b as [134].

Because no metal contact is formed on sink 133, "(none)" appears in FIG. 7b over "142," the reference numeral for the contact formed on sink 123. Also because no metal contact is formed on sink 121 while contact 141 is formed on sink 131, "(141)" appears above "None" in FIG. 7b.

The memory circuit shown in FIGS. 7a and 7b occupies a substantially smaller fraction of the wafer surface than prior art devices. Further, the compact rectangular arrangement of ohmic contacts to the various active and passive regions of the structure facilitates higher packing densities than with the asymmetrical geometric arrangements associated with devices heretofore available. Also, unlike other memory circuits utilizing conductive buried regions, the resistances associated with the bases of the two transistors are equal. This symmetry of resistances associated with each of the two transistors as reflected by the schematic of FIG. 8 allows fabrication of large arrays of individual memory cells as depicted in FIG. 7a without the necessity of additional compensating circuitry. Compensating circuitry is ordinarily required in conjunction with large arrays of nonsymmetrical memory cells, that is, memory cells in which the resistances associated with one transistor of the cell are not identical to those associated with the other transistor of the cell. The symmetrical resistances result from the particular structure shown in FIGS. 7a and 7b, and, in particular, from the formation of two collector sinks in each of the two transistor structures, which two transistor structures suitably interconnected form a single memory cell.

The transistor structures shown in FIGS. 7a and 7b may be fabricated according to the method set forth herein in conjunction with FIGS. 1-5. For example, metal interconnections 140, 141, 142, 143, 144 and 145 may be formed by depositing and masking of suitable electrically conductive material. Metal interconnections 140, 143, 144 and 145 can be utilized to electrically interconnect large arrays of the individual semiconductor structure depicted. In FIGS. 7a and 7b, active and passive semiconductor devices are formed, within the perimeter of the two electrically isolated silicon pockets 113 and 114. The buried collectors 111, 112 and field oxide isolation 115 are also shown.

Emitters 124, 125, 134, 135 and emitter metalization 143, 144, 145 are designated, together with metal interconnect 143 between emitter 124 and emitter 134. (Note that contact metal and metal interconnects are part of the same metal layer.) Conductive buried regions 150, 151, 160, 161, which provide electrical connections around the collector sinks, are shown as dotted lines in collector sinks 121, 123, 131, 133. Regions 120, 122, 130, 132 are openings in the oxide layer to provide ohmic contact to P type resistors and base regions, and metal interconnects 140, 141, 142 between them are also shown.

The various aspects of the structure shown in FIGS. 7a and 7b are given identical designations in the circuit schematic of FIG. 8. For example, the resistance between regions 130 and 132 is designated 130-132 in FIG. 8. Similarly, the electrically conductive material 143 in FIG. 7a is shown as connection 143 in FIG. 8. Also shown in FIG. 8 are the two diodes 170, 171 representative of the junction between epitaxial silicon pocket 113 and buried layer 111 and between pocket 114 and layer 112, respectively. Resistors 130-132, 132-134 and 134-135 are in the epitaxial layer are typically are on the order of 5 K to 20 K ohms. Resistors 131-134 and 134'-135' are in the buried layer 112 and typically are on the order of 100 to 300 ohms. Likewise resistors 120-122, 122-124 and 124-125 are in the epitaxial layer and typically are on the order of 5 K to 20 K ohms. Resistors 123-124 and 124'-125' are in the buried layer 111 and are on the order of 100 to 300 ohms. The resistors in the buried layers in the two cells are not exactly symmetrical but because of their low values, this lack of symmetry is not important to the performance of the circuit and the circuit behaves as though the cell is substantially symmetrical.

The cell shown in FIGS. 7a and 7b is designed to be electrically interconnected with other such cells in the same column by a second layer of metalization formed in a well-known manner. It is interconnected with such cells in the same row by portions 143 and 140 of the first layer metalization.

FIG. 8 also displays one substantial advantage achieved by this invention—the symmetrical resistances associated with each of the transistor structures. Accordingly, it is unnecessary to provide any circuitry to compensate for differences in the resistances associated with the bases and collectors of the two transistor structures.

The compact memory cell design depicted in FIGS. 7a and 7b results from this invention. With this invention conductive buried regions 150, 151, 160 and 161 provide bypasses for collector sinks respectively designated 121, 123, 131, and 133. In prior art memory cells, it was necessary to locate collector sinks such as 121, 123, 131, and 133 non-collinearly from the bases and emitters, since no conductive buried regions were utilized. In particular, prior art devices provided greater separation between electrically isolated pockets 113 and 114 so that the necessary collector sinks could be disposed between them, with the shape of the perimeters 113 and 114 altered accordingly. One such structure is depicted in W. D. Baker and D. A. Laws, "The Isoplanar Process," Fairchild Semiconductor Advertising Brochure, October, 1971.

Figures 9A, 9B:
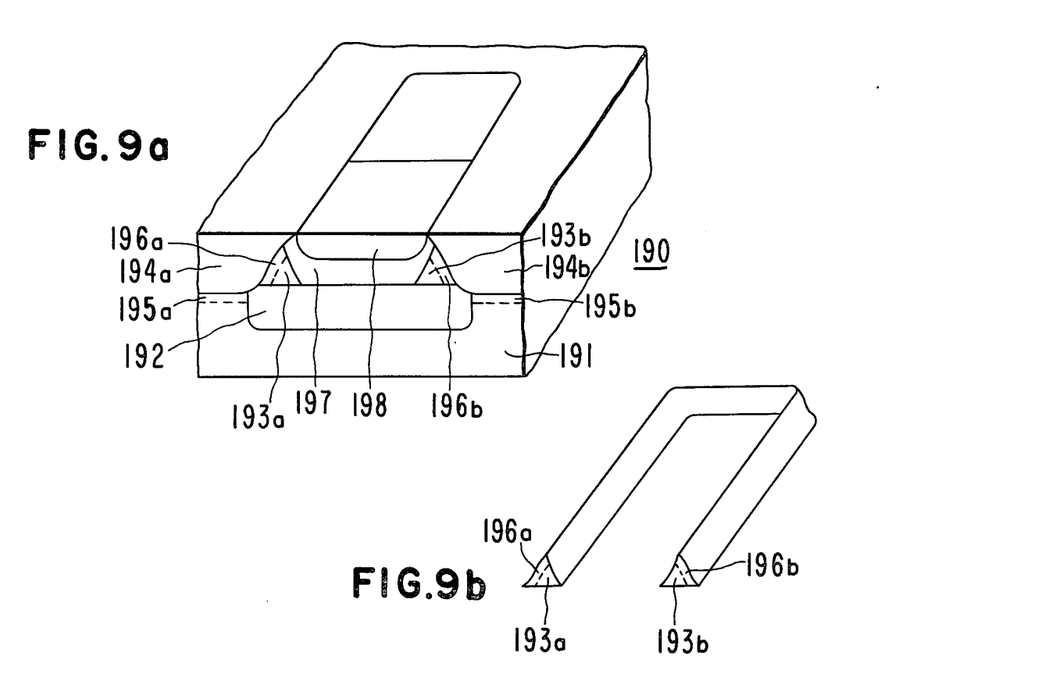
FIGS. 9a and 9b depict a semiconductor structure in which the conductive buried region may function as a collector or emitter of a transistor.

FIGS. 9a and 9b show another embodiment of the structure of this invention. In the manner previously described herein in conjunction with FIGS. 1-5, or utilizing other well-known processes, a semiconductor structure 190 is formed which includes a semiconductor substrate 191, a buried layer 192, an epitaxial pocket 193, oxide isolation 194a and 194b, field predeposition region 195a and 195b, and conductive buried regions 196a and 196b (which are those portions of the field predeposition regions in the epitaxial layer). Into the epitaxial pocket 193 is introduced a base region 197 and collector or emitter 198. If substrate 191 is P type material, then buried layer 192 and base 197 will be N type, while epitaxial pocket 193 will be of either conductivity type, while conductive buried region 196 and region 198 will all be P type material. If epitaxial layer 197 is N type, this N type material can form the base of the transistor. Depending upon the electrical connections made to structure 190, conductive buried region 196 will function as either the collector or emitter or the transistor formed in pocket 193. If a conductive buried region 196 functions as an emitter than region 198 will be a collector, while if conductive buried region 196 is a collector, then region 198 will be an emitter. The structure of FIGS. 9a and 9b is particularly useful because a pair of collector or emitter connected highly compact transistor structures are formed. FIG. 9b more clearly depicts a portion of the structure shown in FIG. 9a.

In any of the above discussed application or embodiments, the cross-sectional dimensions of the conductive buried layer or walled resistor formed according to this invention are largely independent of optical masking technology. The width of the conductive buried region, as measured from the buried collector upward along the field oxide wall, is controlled by the thickness of the epitaxial layer. The thickness of the conductive buried region, as measured perpendicular to the oxide wall, may be controlled by varying the depth and concentration of the field predeposition and the collector sink diffusion. Note that the structures with which this invention is particularly useful have walled emitters to obtain minimum area per cell and this invention is particularly useful with such emitters.

Although the structure of this invention has been discussed in conjunction with specific conductivity type materials, opposite conductivity type semiconductor materials may be substituted for those specified in each embodiment. For example, an N type opitaxial layer may be formed rather than the P type layer described, and the conductivity types of all other regions of the semiconductor structure suitably altered, although in some embodiments the conductivity type of only selected regions need be changed. Additionally, the conductive buried region of this invention may be formed without a collector sink by forming the conductive buried region in an epitaxial layer of opposite conductivity type to the field predeposition. Further, while certain embodiments of this invention have been described herein, other related structures and processes will be obvious in view of this disclosure.

Figure 10A:
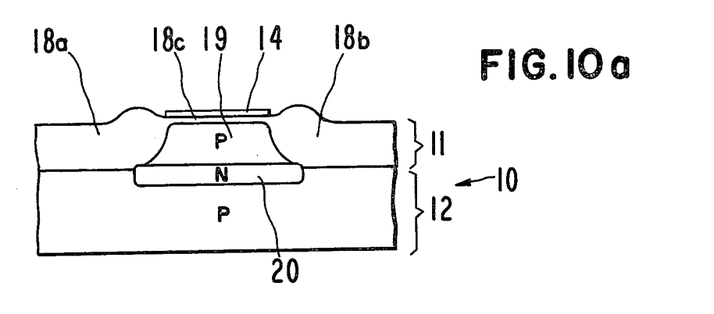
FIGS. 10a through 10d illustrate one method of manufacturing a sink region in accordance with this invention.
Figure 10B:
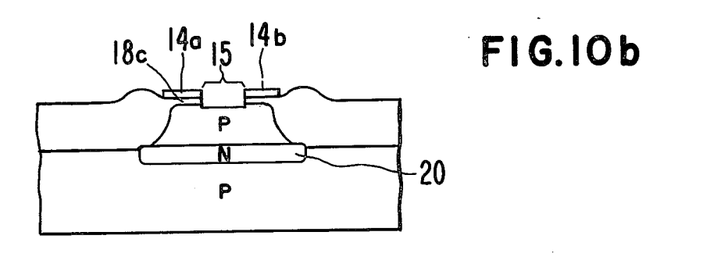

FIGS. 10a through 10d illustrate one process of manufacturing my invention embodying a unique method of self-aligning the source and drain regions with the diffused gate region of the junction field-effect transistor shown, for example, in FIGS. 6a and 6b. FIG. 10a shows a cross-section of a semiconductor structure containing a pocket 19 of semiconductor material the lateral dimensions of which are determined by oxidized regions of semiconductor material 18a, 18b extending through the semiconductor material to a laterally-extending PN isolation junction (in FIG. 10a, represented by the junction between buried region 20 of a first conductivity type and underlying substrate 12 of a second and opposite conductivity type). Pocket 19 is also of opposite conductivity type. Overlying pocket 19 and in fact comprising an extension of oxide 18a and 18b is a thin oxide layer 18c. Oxide 18c covers the top surface of semiconductor pocket 19. Overlying oxide layer 18c is a layer of a second insulation 14, typically silicon nitride. The cross-section of the structure shown in FIG. 10a is well known and for example is shown in the above-cited Peltzer U.S. Pat. No. 3,648,125.

Figure 10C:
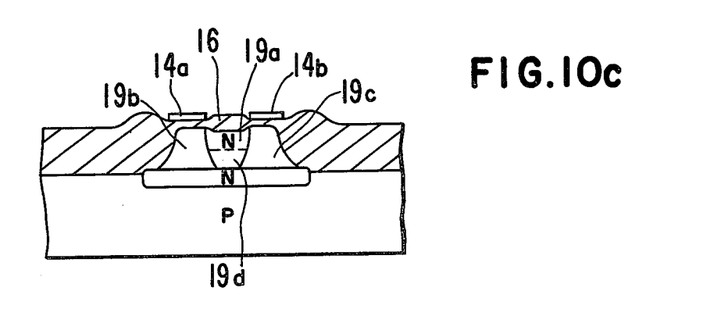

My invention turns to advantage the silicon nitride oxide insulation formed over pocket 19 to provide a unique process which yields a junction field-effect transistor with a diffused gate region self-aligned with the source and drain regions. To do this, a window 15 is formed by suitable masking and etching steps in the composite insulation layer 14 and 18c. Preferably, the window is located in the middle of this layer to ensure symmetry between the source and drain regions of the to-be-formed junction field-effect transistor but window 15 can, of course, assume any location appropriate for the characteristics of the desired junction field-effect transistor. Following the formation of window 15, an N type dopant is diffused or otherwise placed in the semiconductor material left exposed by window 15. The resulting N type region 19a is shown in FIG. 10c and extends into contact with buried layer 20. Simultaneously with, or following, the formation of region 19a, oxide 16 is formed upon the surface of the exposed semiconductor material in pocket 19. Oxide 16 is purposely grown thicker than the oxide layer 18c, as shown in FIG. 10c. Next, windows 17a and 17b (FIG. 10d) are opened in nitride layers 14a, 14b and the underlying remaining portions of oxide layer 18c to expose the P type regions 19b and 19c which comprise the source and drain regions, for example of the junction field-effect transistor.

Figure 10D:
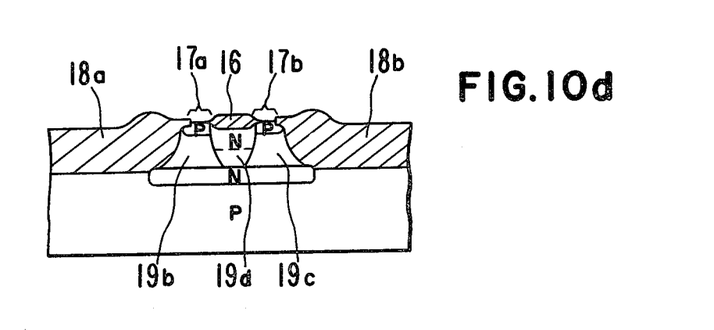

The self-aligned feature is achieved by exposing region 16 to the same etching media are used to open windows 17a and 17b. For properly selected etching media (for example hot phosphoric acid to remove nitride layers 14a and 14b and buffered hydrofloric acid to remove the selected portions of oxide layer 18c), oxide thicknesses, and etch times, the nitride layers 14a and 14b and the oxide layers 18c can be completely removed and still leave enough of oxide layer 16 to mask against the subsequent P+ diffusion into regions 17a and 17b as shown in FIG. 10d. Typically, oxide layer 16 may be two to four thousand angstroms thick while 18c is a few hundred angstroms thick.

As described above in conjunction with the detailed description of the conductive buried regions, the formation of region 19a takes place under conditions such that a conductive buried region 19d remains between the lower portions of region 19a and the adjacent oxide 18. Conductive buried region 19d and its counterpart (not shown in FIGS. 10c and 10d) serve as the conductive channel between the source and drain regions of the junction FET. This channel can, of course, be pinched off by application of proper voltage to the gate comprising region 19a and the underlying buried layer 20. In typical embodiments, a potential difference of two volts between the gate and the channel region pinches off the channel region.

In the operation of the junction field-effect transistor of this invention, a positive potential relative to P type regions 19b, 19c is applied to the gate regions 19d and 20 thereby to back-bias the PN junctions formed between the gate regions and source 19b, drain 19c and conductive channel 19d. The application of an increasingly positive voltage to region 19a relative to regions 19b, 19c and 19d results in the depletion of holes from region 19d thereby varying its conductivity.

FIG. 10d shows the way in which contacts are formed to the source and drain regions 19b, 19c by the formation of windows 17a and 17b in silicon nitride 14a, 14b and underlying oxide 18. In addition, additional P type impurities can be diffused through windows 17a and 17b if desired to form contact regions to the top surfaces of these regions or alternatively to form P type source and drain regions. A particular case of interest is one in which the semiconductor pocket is of N type silicon material rather than P type silicon material. In this situation, the conductive buried region extends directly adjacent to the oxide regions 18a, 18b into contact with the diffused or otherwise formed P type regions 17a and 17b.

In typical embodiments, pocket 19 is formed of eptiaxial silicon material formed on substrate 20 in a manner well known in the semiconductor arts.

What is claimed is:

1. The method of forming a junction field-effect transistor in a pocket of semiconductor material of a first conductivity type electrically isolated from adjacent pockets by insulation extending through said semiconductor material to a laterally extending PN isolation junction, the pocket of semiconductor material being separated from the insulation by a conductive buried region of first conductivity type impurity of different concentration than the pocket, including additional insulation capable of masking against oxidation of the underlying semiconductor material formed on and overlying the top surface of said pocket, comprising:

forming a window through said additinal insulation to expose a selected portion of the top surface of said semiconductor pocket;

placing a selected conductivity-type-determining impurity in the region of semiconductor material to form a region of opposite conductivity type in said semiconductor material beneath said window, said region of opposite conductivity type extending from the surface of said semiconductor material through said semiconductor pocket into electrical contact with said laterally extending PN isolation junction, but leaving a conductive buried region of said first conductivity type between of said region of opposite conductivity and said insulation at least at said PN junction, said region of opposite conductivity type dividing said pocket of semiconductor material into two pockets of semiconductor material of first conductivity type, said two pockets being connected by said conductive buried region;

oxidizing said semiconductor material exposed by said window to a selected thickness sufficient to prevent the passing of selected impurities into said region of opposite conductivity type;

removing at least a portion of the remaining additional insulation to expose other portions of the top surface of said semiconductor material in said pocket; and placing another conductivity-type-determining impurity in the semiconductor material beneath said other portions of the top surface of said semiconductor material.

2. The method of claim 1 wherein said additional insulation comprises a layer of silicon nitride formed on and adherent to a layer of silicon oxide formed on and adherent to said underlying semiconductor material.

3. The method of claim 1 wherein said region of opposite conductivity type is formed to have an impurity concentration less than the impurity concentration in the semiconductor material beneath said other portions of the top surface of said semiconductor material.

4. The method of claim 1 wherein said region of opposite conductivity type is formed by ion-implantation.

5. The method of claim 1 wherein said region of opposite conductivity type forms a portion of the gate of a junction field-effect transistor.

6. The method of claim 1 wherein said laterally extending PN isolation junction is formed between a buried collector layer and a substrate, and said buried collector layer comprises another portion of said gate.

7. The method of claim 1 including the step of forming electrical contacts to said region of opposite conductivity type and to said two regions of first conductivity type separated by said region of opposite conductivity type.

8. The method of forming a junction field-effect transistor in a pocket of semiconductor material isolated from adjacent pockets of semiconductor material by insulation extending through said semiconductor material to a laterally extending PN isolation junction, the pocket of semiconductor material being separated from the insulation by a conductive buried region of first conductivity type impurity of different concentration than the pocket, said pocket of semiconductor material being of a first conductivity type and having additional insulation overlying the top surface of said pocket of semiconductor material, comprising:

forming two windows in said insulation to expose two portions of the top surface of said semiconductor pocket, said two portions being separated by a selected distance; and placing a selected impurity in said pocket of semiconductor material through said two windows thereby to convert two selected regions of said pocket to the conductivity type opposite to said first conductivity type, said two regions of opposite conductivity type being separated by a region of said pocket of said first conductivity type but being formed a sufficient distance into said pocket to contract the conductive buried region of said opposite conductivity type formed in said pocket directly adjacent said insulation above said laterally extending PN isolation junction.

* * * * *